United States Patent
James et al.

(10) Patent No.: US 6,689,678 B2
(45) Date of Patent: Feb. 10, 2004

(54) PROCESS FOR FABRICATING BALL GRID ARRAY PACKAGE FOR ENHANCED STRESS TOLERANCE

(75) Inventors: Richard D. James, Plano, TX (US); Leslie E. Stark, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/370,140

(22) Filed: Feb. 19, 2003

(65) Prior Publication Data

US 2003/0153160 A1 Aug. 14, 2003

Related U.S. Application Data

(62) Division of application No. 09/654,540, filed on Sep. 1, 2000, now Pat. No. 6,583,515.
(60) Provisional application No. 60/152,438, filed on Sep. 3, 1999.

(51) Int. Cl.[7] .............................................. H01L 21/44
(52) U.S. Cl. ................... 438/612; 436/613; 436/614; 257/730; 257/738; 257/779
(58) Field of Search ................... 438/612–614, 438/464–465

(56) References Cited

U.S. PATENT DOCUMENTS

| 5,376,584 | A | * | 12/1994 | Agarwala | ................... 438/614 |
| 5,604,379 | A | * | 2/1997 | Mori | ........................... 257/738 |
| 5,962,918 | A | | 10/1999 | Kimura | |
| 6,028,356 | A | | 2/2000 | Kimura | |
| 6,314,641 | B1 | | 11/2001 | Akram | |
| 6,472,759 | B1 | | 10/2002 | Kimura | |

* cited by examiner

*Primary Examiner*—D Le
(74) *Attorney, Agent, or Firm*—Wade James Brady, III; Frederick J. Telecky, Jr.

(57) ABSTRACT

The thermomechanical stress sensitivity of ball grid array (BGA) solder connections is significantly reduced, when the solder connections solidify in column-like contours after the reflow process—a result achieved by using the solder material in tapered openings of a thick sheet-like elastic polymer adhered to the BGA substrate and selected for its characteristics of non-wettability to solder and volumetric shrinkage greater than solder.

7 Claims, 2 Drawing Sheets

PROCESS FOR FABRICATING BALL GRID ARRAY PACKAGE FOR ENHANCED STRESS TOLERANCE

This is a divisional application of Ser. No. 09/654,540, filed Sep. 1, 2000 now U.S. Pat. No. 6,583,515, which is a non-provisional application claiming priority from provisional application Serial No. 60/152,438, filed Sep. 3, 1999.

FIELD OF THE INVENTION

The present invention is related in general to the field of semiconductor devices and processes and more specifically to structure, materials and fabrication of high-performance, high I/O solder-attached and ball grid array packages.

DESCRIPTION OF THE RELATED ART

Ball Grid Array (BGA) packages have emerged as an excellent packaging solution for integrated circuit (IC) chips with high input/output (I/O) count. BGA packages use sturdy solder balls for surface mount connection to the "outside world" (typically plastic circuit boards, PCB) rather sensitive package leads, as in Quad Flat Packs (QFP), Small Outline Packages (SOP), or Tape Carrier Packages (TCP). Some BGA advantages include ease of assembly, use of surface mount process, low failure rate in PCB attach, economic use of board area, and robustness under environmental stress. The latter used to be true only for ceramic BGA packages, but has been validated in the last few years even for plastic BGAs. From the standpoint of high quality and reliability in PCB attach, BGA packages lend themselves much more readily to a six-sigma failure rate fabrication strategy than conventional devices with leads to be soldered.

A BGA package generally includes an IC chip, a multilayer substrate, and a heat spreader. The chip is generally mounted on the heat spreader using a thermally conductive adhesive, such as an epoxy. The heat spreader provides a low resistance thermal path to dissipate thermal energy, and is thus essential for improved thermal performance during device operation, necessary for consistently good electrical performance. Further, the heat spreader provides structural and mechanical support by acting as a stiffener, adding rigidity to the BCA package, and may thus be referred to as a heat spreader/stiffener.

One of the substrate layers includes a signal "plane" that provides various signal lines, which can be coupled, on one end, to a corresponding chip bond pad using a wire bond (or to a contact pad using flip-chip solder connection). On the other end, the signal lines are coupled with solder "balls" to other circuitry, generally through a PCB. These solder balls form the array referred to in a BGA. Additionally, a ground plane will generally be included on one of the substrate layers to serve as an active ground plane to improve overall device performance by lowering the inductance, providing controlled impedance, and reducing cross talk. These features become the more important the higher the BGA pin count is.

In contrast to the advantages of the BGA packages, prevailing solutions in BGA packages have lagged in reliability characteristics such as insensitivity to temperature cycling or moisture environment. BGA packages suffer from the drawback that, in operation and temperature excursions, they are sensitive to thermomechanical stress due to the mismatch between the coefficients of thermal expansion of the semiconductor material and the printed circuit board material.

These reliability risks, as well as the requirements for special cad metallizations, have been described in a series of detailed publications by the International Business Machines Corporation in 1969 (IBM, J. Res. Develop., Vol. 13, pp. 226–296): P. A. Totta et al., *SLT Device Metallurgy and its Monolithic Extension*, L. F. Miller, *Controlled Collapse Reflow Chip Joining*, L. S. Goldmann, *Geometric Optimization of Controlled Collapse Interconnections*, K. C. Norris et al., *Reliability of Controlled Collapse Interconnections*, S. Oktay, *Parametric Study of Temperature Profiles in Chips Joined by Controlled Collapse Techniques*, B. S. Berry et al., *Studies of the SLT Chip Terminal Metallurgy*.

During actual BGA operation, significant temperature differences and temperature cycles between semiconductor chip and substrate will appear. Consequently, the reliability of the assembly is strongly influenced by the coefficients of thermal expansion of the semiconductor and the substrate. For example, there is more than one order of magnitude difference between the coefficients of thermal expansion of silicon and FR-4. This difference causes thermomechanical stresses which the solder joints have to absorb. Detailed calculations, in the literature references cites above and in others, of the optimum height and volume of the solder joint and the expected onset of thermal fatigue and cracking showed that it is desirable to have

- a highly ductile solder;
- a high ultimate shear strength of the chip/joint and substrate/joint interfaces;
- a large value for the ratio (radius of bump-to-chip contact)/(distance to neutral point of chip).

With the ongoing trend to increase chip sizes and to reduce area consumption for bonding pads, both driven by cost reduction efforts, the latter goal is obtained ever less and has to substituted by other improvements.

One method aims at absorbing part of the thermomechanical stress on the solder joints by plastic material surrounding the joints and filling the gap between chip and substrate (designated 15 in FIG. 1). See for instance, U.S. patent applications Ser. Nos. 60/084,416, 60/084,440, and 60/084,472, filed May 06, 1998 (Thomas et al., *Low Stress Method and Apparatus of Underfilling Flip-Chip Electronic Devices*). However, this method is expensive, because it represents an additional process step, and it may not be welcome since the customer may have to perform the process after device attachment to the motherboard.

Another method aims at intentionally sacrificing solder joints located in extreme locations (for instance, in chip corners) where the stress is highest, in order to save the majority of joints from failure. However, this method consumes valuable semiconductor real estate and it thus expensive; it is generally more a defense against the problem than an avoidance of the problem.

Another method aims at designing electrical redundancy of chip input/output terminals; see for instance U.S. patent application Ser. No. 60/080,122, filed Mar. 31, 1998 (Ibnabdeljalil et al., *Electrical Redundancy for Improved Mechanical Reliability in Ball Grid Array Packages*). However, this method consumes valuable input/output terminals and semiconductor real estate, and is thus expensive; it is generally more a defense against the problem than an avoidance of the problem.

An urgent need has therefore arisen for a coherent, low-cost method of fabricating BGAs and assemblies of semiconductor devices on circuit boards offering a fundamental solution for thermomechanical stress reliability. The method should be flexible enough to be applied for different semiconductor product families and a wide spectrum of design and process variations, should allow the usage of various formulations of substrate material, and should achieve improvements toward the goal of small outline and low profile packages. Preferably, these innovations should be accomplished using the installed equipment base so that no investment in new manufacturing machines is needed.

SUMMARY OF THE INVENTION

According to the present invention, the thermomechanical stress sensitivity of ball grid array (BGA) solder connections is eliminated, when the solder connections solidify in column-like contours after reflow—a result achieved by using the solder material in tapered openings of a thick sheet-like elastic polymer adhered to the BGA substrate and selected for its characteristics of non-wettability to solder and volumetric shrinkage greater than solder.

The present invention relates to high density, high speed integrated circuits in ball grid array packages and to packages which have an outline similar to the integrated circuit chip itself. It also applies to chips with solder balls assembled by flip technology. These circuits can be found in many device families such as processors, digital and analog devices, memory and most logic devices, high frequency and high power devices, especially in large chip area categories. The invention helps to alleviate the space constraints in continually shrinking applications such as cellular communications, pagers, hard disk drives, laptop computers and medical instrumentation.

It is an aspect of the present invention to be applicable to a variety of different semiconductor solder-ball-assembled package designs; for example, the chips may be assembled by wire bonding and overmolding, or by a flip-chip process with or without underfilling. A variety of substrate designs or stacks of metal-insulator layers may be used.

Another aspect of the invention is to utilize existing semiconductor fabrication processes and to reach the assembly goals without the cost of equipment changes and new capital investment, by using the installed fabrication equipment.

Another aspect of the invention is to be applicable to a variety of different solder ball sizes and compositions, as long as the polymer tape is not wettable by the selected solder and has a higher volumetric shrinkage than the selected solder.

These aspects have been achieved by the teachings of the invention concerning methods suitable for mass production. Various modifications have been employed for the assembly of semiconductor chips and insulating substrates.

In one embodiment of the invention, an interconnection substrate comprises an electrically insulating support, having a plurality of contact pads disposed on its surface, and a sheet-like elastic polymer, non-wettable by solder and having a coefficient of volumetric shrinkage greater than solder, adhering to the support. Openings in the polymer sheet expose the contact pads. After solder connections are reflowed onto the contact pads, without wetting the walls of the opening, the cooling cycle creates column-like contours of the solidifying solder as well as a gap between the solder and the walls, due to the volumetric shrinkage of the polymer. The resulting column-like solder connections have sufficient length after board attach to act as stress-distributing joints.

In another embodiment of the invention, complete semiconductor BGA devices are assembled using substrates with the thick and solder non-wettable sheet-like elastic polymer adherent to the substrate surface. Again, column-like solder connections are formed in the cooling cycle after the reflow process.

In yet another embodiment of the invention, the thick and solder non-wettable sheet-like elastic polymer is attached to the semi-finished semiconductor package in a sort of "retrofit" before the solder balls are attached. By this method, existing devices can be "upgraded" to obtain, upon completion of the solder reflow cycle, the feature of stress-insensitive solder connections.

The technical advances represented by the invention, as well as the aspects thereof, well become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
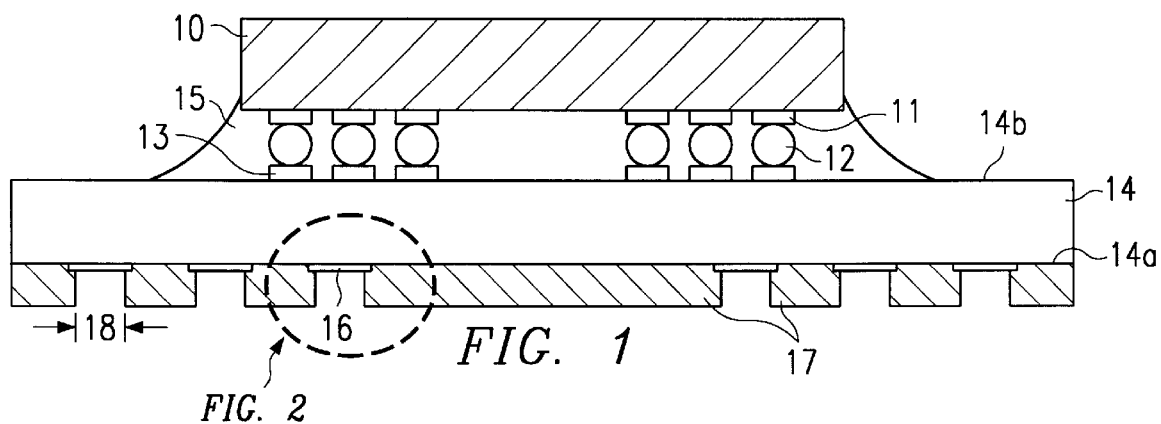
FIG. 1 is a schematic and simplified cross section of a BGA package having a substrate with a sheet-like polymer according to the invention.

FIG. 1 illustrates schematically the main features of a semiconductor device based on ball grid array (BGA) assembly and flip-chip technology. The integrated circuit (IC) of chip 10 has bonding pads 11 made of multi-layer metallization and solder material 12, usually in the form of balls or bumps, usually having a diameter in the range from about 0.1 to 0.4 mm. Several methods are available to achieve consistency of geometrical shape by controlling amount of material and uniformity of reflow temperature.

As defined herein, the term solder "balls" does not imply that the solder contact are necessarily spherical. They may have various forms, such as semispherical, half-dome, truncated cone, or generally bump. The exact shape is a function of the deposition technique (such as evaporation, plating, or pre-fabricated units) and reflow technique (such as infrared or radiant heat), and the material composition. The solder balls comprise attach materials selected from a group consisting of tin/lead, tin/indium, tin/silver. tin/bismuth, solder paste, and conductive adhesive compounds.

In the standard flip-chip process, the chip is flipped upside down, brought in contact with contact pads 13 on the second surface 14b of support 14, and subjected to the melting temperature of the solder alloy so that the solder reflows. After cooling, the chip 10 is attached to substrate 14. The gap between the chip and the support and the space between the solder joints is usually filled with plastic underfill material 15 in order to mitigate thermomechanical stress and reduce reliability risks on the solder joints.

Support 14 consists of electrically insulating material such as polyimide, but conductive routing strips (not shown in FIG. 1) are integral with support 14. They connect the contact pads 13 to terminal contact pads 16 on the first surface 14a of support 14. Both pads 13 and 14 have a composition suitable for solder attachment. Commonly, they are made of copper with a flash of gold or palladium, but they may have a surface of refractory metal followed by platinum. Together, the insulating support, the conductive routing strips and the pluralities of contact pads on both surfaces constitute the package substrate.

In standard BGAs, solder balls would be disposed on terminal pads 16 to connection to printed circuit boards or motherboards. Unfortunately, these packages suffer from the severe drawback that, in operation and temperature excursions, they are very sensitive to thermomechanical stress due to the mismatch between the coefficients of thermal expansion of the semiconductor material, the substrate material, and the motherboard.

According to the invention, a sheet-like elastic polymer 17 is adhered to the first surface 14a of the support 14. The polymer material 17 preferably should exhibit several characteristics cooperatively:

The polymer material has to be non-wettable by solder;

it should have a coefficient of volumetric shrinkage greater than solder, when cooled from solder reflow temperature to ambient temperature;

it should be elastic and have a low modulus in order to prevent gross package warpage;

it should be robust relative to the temperature cycles of repeated solder reflows.

Suitable examples of the polymer material are elastomers, low modulus polyimides, epoxies, silicones, and generally pressure-sensitive adhesives. As an example, a preferred polymer material is commercially sold under the trademark "Novaclad" by Sheldahl Micro Products, 1285 South Fordham Street, Longmont, Colo., 80503 USA. Other commercial (American and Japanese) polyimide and silicone materials exhibiting the desired non-wettability and shrinkage characteristics are readily available.

The preferred method is to select the polymer material as a sheet-like tape; the thickness is in the range from about 80 to 300 $\mu$m dependent on the intended solder ball sizes. First, the plurality of openings 18 are prepared in a pattern matching the pattern of contact pads 16 on the first substrate surface. For a polymer in sheet form, the openings are punched through the sheet, preferably in one process step. Second, the polymer sheet is aligned with the substrate such that each of the openings 18 is placed in alignment with one of the contact pads 16. The sheet is finally attached to the substrate surface using elevated temperature (preferably 120 to 180° C.)

Figure 2:
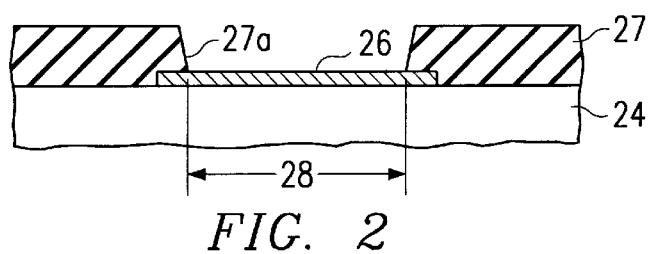
FIG. 2 is a schematic cross section of a portion of a BGA substrate having a sheet-like polymer according to the invention.

As an example, one of the polymer openings 18 of FIG. 1 is shown in more magnified cross sectional view in FIG. 2. The dielectric support 24 has a contact pad 26 with a surface suitable for solder attachment. The polymer sheet 27, thickness between about 80 to 300 $\mu$m, has an opening 28 of a width determined by the size of the intended solder connection. The walls 27a of the opening are either vertical or slightly tapered towards the pad 26.

Instead of using a sheet, the polymer material may alternatively be molded onto the substrate surface, or may be applied to the surface by syringes, followed by curing (polymerization) steps. In these cases, the openings have to be created, for instance, by photolithographic processes.

Figure 3:
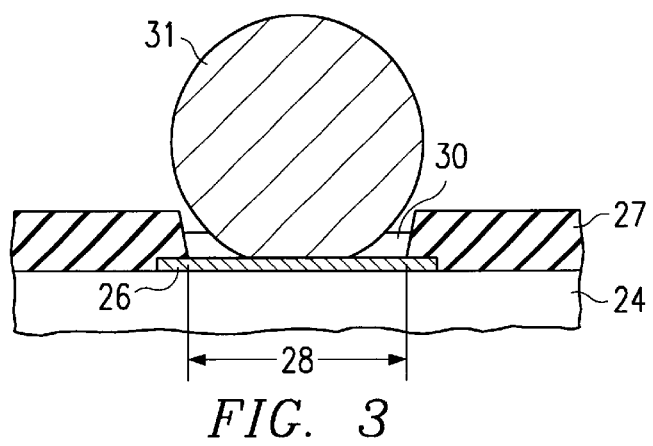
FIG. 3 is a schematic cross section of the BGA substrate portion depicted in FIG. 2 with solder paste and solder ball before solder reflow.

As shown in FIG. 3, solder paste 30 is applied into opening 28, together with solder material. Instead of solder paste, other options include flux, or treatment of contact pad 26 by a brief plasma exposure. As illustrated in FIG. 3, the solder material may be a pre-fabricated ball 31; other methods include evaporation or plating. The solder material is selected from a group consisting of tin/lead, tin/indium, tin/silver, tin/bismuth, and conductive adhesive compounds (as long as they have a coefficient of volumetric shrinkage smaller than the polymer material employed in surface sheet 27). For many BGA packages, the solder connection material has a volume corresponding to balls of about 300 to 700 $\mu$m diameter.

Figure 4:
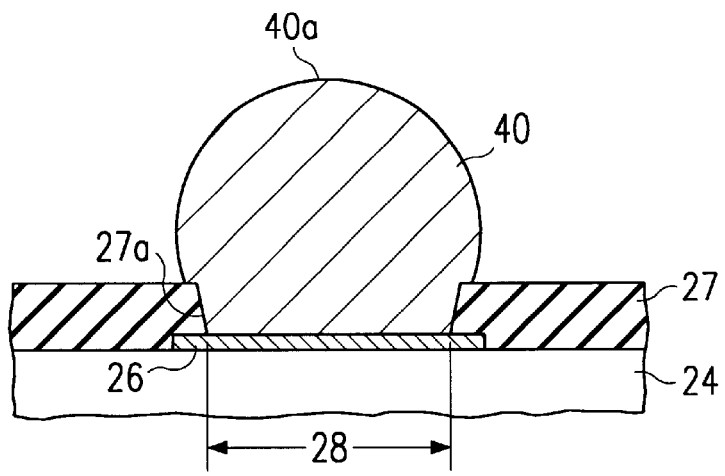
FIG. 4 is a schematic cross section of the BGA substrate portion depicted in FIG. 3 during solder reflow.

In FIG. 4, the solder material 40 has reached its reflow temperature and is liquid. The reflow temperature is the eutectic melting temperature of the solder alloy, typically in the range from about 170 to 240° C. The molten solder fills the complete opening 28 in polymer sheet 27, and establishes good electrical contact to terminal pad 26. The surface 40a of solder material 40 is pulled into the form determined by the equilibrium of the surface tension forces.

It is of pivotal importance for the present invention that solder material 40 does not wet the walls 27a of the polymer sheet 27 surrounding opening 28.

Figure 5:
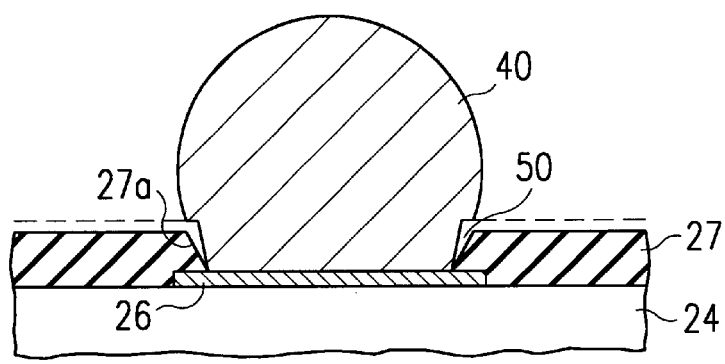
FIG. 5 is a schematic cross section of the BGA substrate portion depicted in FIG. 4 after solder reflow.
Figure 6:
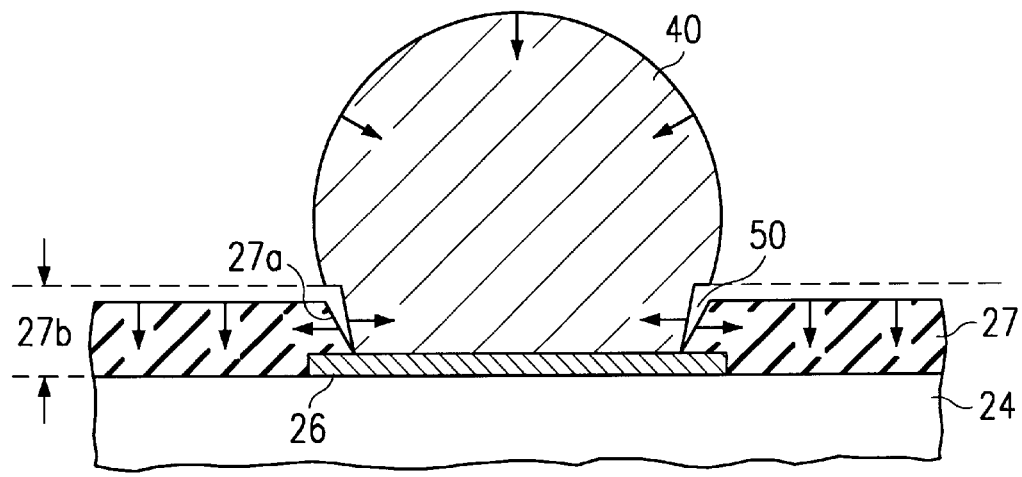
FIG. 6 is a schematic cross section of a BGA substrate portion illustrating the surface tension and shrinkage forces in the solder cooling cycle after reflow.

FIGS. 5 and 6 illustrate the relative shrinkages of the polymer material 27 and the solder material 40 in the temperature cooling time period after the solder reflow cycle. Since the solder has not been wetting the polymer walls 27a, the solder connections are shaped, upon cooling, in column-like contours. These contours have an elongated form including convex, concave, or truncated surfaces. For the most part, the height of the elongation is given by the original thickness 27b of the polymer sheet.

Since the polymer material has a greater coefficient of shrinkage than the solder material (as symbolized by the larger arrows in FIG. 6), the cool-down temperature cycle creates a gap 50 around the solidifying and shrinking solder. The polymer walls 27a shrink into a pronounced tapering, finally inclining about 2 to 10° towards the contact pad 26 (as measured from the original vertical position) and assuming a somewhat lowered surface compared to the original position.

The column-like solder connections shown in FIGS. 5 and 6 will be re-created after each reflow cycle, such as a board attach process of the BGA package onto a printed circuit board. Due to the elongation, the solder connections approach the configuration calculated to be favorable for insensitivity against stress (see series of IBM publications in 1969). The solder connections of FIGS. 5 and 6, created by the present invention, have sufficient length to act as stress-distributing joints, thus eliminating the package reliability failures caused by thermomechanical stress.

Instead of using the flip-chip process to attach the IC chip to the substrate, as shown in FIG. 1, a standard attach using adhesives followed by bonding wire connection, may be chosen. The creation of column-like solder connections to the substrate contact pads, as described above, remains the same. Consequently, the invention can be applied to wire-bonded chips in BGA packages.

The process of the present invention, to attach a thick polymer sheet to an BGA package for creating elongated solder connections, can also be used as a "retrofit" to finished BGA devices. These devices have the IC chip already attached onto the second substrate surface with a plurality of terminal pads exposed on the first substrate surface. For this purpose, a sheet-like elastic polymer non-wettable to solder and having a coefficient of volumetric shrinkage greater than solder, is supplied in the desired thickness. The sheet has the plurality of openings prepared in a pattern matching the pattern of the contact terminals on the first BGA substrate surface. The polymer sheet is aligned with the BGA substrate such that each of the sheet openings is placed into alignment with one of the terminal contact pads.

The polymer sheet is then attached the first substrate surface using elevated temperature. The contact pads remain exposed. Solder paste (or flux) and one solder ball is applied to each contact opening. The solder is reflowed at the solder melting temperature. It establishes contact to the pads, but does not wet the polymer walls of the openings. When the temperature is lowered to ambient temperature, the polymer shrinks volumetrically more than the solder which solidifies in column-like contours. A gap is thus created between the solder column and the retreating polymer walls, enabling the solder column to perform its stress-absorbing capability.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the material of the semiconductor chip may comprise silicon, silicon germanium, gallium arsenide, or any other semiconductor material used in manufacturing. As another example, the package may be a BGA package or any other semiconductor device package using solder ball connections. As another example, the method of the invention may be applied to the solder bumps attached to chips in order to enhance to enhance the insensitivity of flip-chip devices against thermomechanical stress. It is therefore intended that the appended claims encompass any such modifications or embodiments.

We claim:

1. A process for fabricating an interconnection substrate for use in semiconductor assembly, comprising the steps of:
    providing a support of electrically insulating material having a plurality of contact pads disposed on the surface of said support, said pads having a composition suitable for solder attachment;
    providing a sheet-like elastic polymer non-wettable by solder and having a coefficient of volumetric shrinkage greater than solder, said sheet having a plurality of openings in a pattern matching the pattern of said contact pads;
    aligning said polymer sheet with said support such that each of said openings is placed into alignment with one said contact pads; and
    attaching said polymer sheet to said support surface using elevated temperature, thereby selectively exposing said contact pads and tapering the walls of said openings towards said pads.

2. The method according to claim 1 wherein said elevated temperature is in the range from about 120 to 180° C.

3. A process for fabricating a semiconductor assembly comprising the steps of:
    providing a substrate having an electrically insulating support with first and second surfaces and a plurality of routing strips integral with said substrate, said first surface having a plurality of contact pads suitable for solder attachment and further covered by a sheet-like elastic polymer, non-wettable by solder and having a coefficient of volumetric shrinkage greater than solder, said sheet having openings exposing each of said pads, the walls of said openings tapered towards said pads;
    attaching an integrated circuit chip to said second substrate surface;
    electrically connecting said chip to said second surface using bonding wires;
    surrounding said chip and said bonding wires with an encapsulation compound;
    positioning one solder ball in each of said openings;
    elevating the temperature to reflow said solder, thereby attaching said solder to said pad metallization while not wetting said polymer walls; and
    lowering said reflow temperature to room temperature, thereby volumetrically shrinking said polymer more than said solder, thus creating a gap between said solder and said opening walls and shaping said solder into column-like contours.

4. The process according to claim 3 wherein said solder reflow temperature is the eutectic temperature of the solder mixture or in the temperature range from about 170 to 240° C.

5. A process for fabricating a semiconductor assembly comprising the steps of:
    providing a substrate having an electrically insulating support with first and second surfaces and a plurality of routing strips integral with said substrate, said first and second surfaces having a plurality of contact pads suitable for solder attachment, said first surface further covered by a sheet-like elastic polymer non-wettable by solder and having a coefficient of volumetric shrinkage greater than solder, said sheet having openings exposing each of said pads, the walls of said openings tapering towards said pads;
    attaching and electrically connecting an integrated circuit chip to said contact pads on said second substrate surface using chip solder bumps in flip process;
    positioning one solder ball in each of said openings;
    elevating the temperature to reflow said solder, thereby attaching said solder to said pad metallization while not wetting said polymer walls; and
    lowering said reflow temperature to room temperature, thereby volumetrically shrinking said polymer more than said solder, thus creating a gap between said solder and said opening walls and shaping said solder into column-like contours.

6. The process according to claim 5 further comprising the step of filling with a polymeric encapsulant any gaps between said substrate and said chip left void after said chip solder bumps are adhered to said substrate.

7. A process for fabricating a semiconductor assembly comprising the steps of:
    providing a substrate having an electrically insulating support with first and second surfaces and a plurality of routing strips integral with said substrate, said first and second surfaces having a plurality of contact pads suitable for solder attachment;
    attaching and electrically connecting an integrated circuit chip to said contact pads on said second substrate surface using chip solder bumps in flip process;
    providing a sheet-like elastic polymer non-wettable by solder and having a coefficient of volumetric shrinkage greater than solder, said sheet having a plurality of openings in a pattern matching the pattern of said contact pads on said first substrate surface;

aligning said polymer sheet with said substrate such that each of said openings is placed into alignment with one said contact pad on said first substrate surface;

attaching said polymer sheet to said first substrate surface using elevated temperature, thereby selectively exposing said contact pads and tapering the walls of said openings towards said pads;

positioning one solder ball in each said opening;

elevating the temperature to reflow said solder, thereby attaching said solder to said pad metallization while not wetting said polymer walls; and lowering said reflow temperature to ambient temperature, thereby volumetrically shrinking said polymer more than said solder, thus creating a gap between said solder and said opening walls and shaping said solder into column-like contours.

* * * * *